(12) United States Patent
Nightingale et al.

(10) Patent No.: US 8,007,306 B2
(45) Date of Patent: *Aug. 30, 2011

(54) ELECTRICAL CONNECTION SYSTEM

(75) Inventors: Christopher George Edward Nightingale, Singapore (SG); Wai Hong Lee, Singapore (SG); Boon Hou Tay, Singapore (SG); Swee Ming Goh, Singapore (SG); Teck Wee Ang, Singapore (SG)

(73) Assignee: Dragon Engergy Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 12/432,431

(22) Filed: Apr. 29, 2009

(65) Prior Publication Data

US 2010/0068924 A1 Mar. 18, 2010

(30) Foreign Application Priority Data

Sep. 12, 2008 (SG) ............................... 200806821-5

(51) Int. Cl.
*H01L 31/042* (2006.01)
(52) U.S. Cl. ........................................ 439/366; 136/244
(58) Field of Classification Search .................. 439/366, 439/500; 135/244
See application file for complete search history.

(56) References Cited

U.S. PATENT DOCUMENTS

| 2,303,483 | A |   | 12/1942 | Ludwig |   |
|---|---|---|---|---|---|
| 2,320,332 | A |   | 5/1943 | Morten |   |
| 3,501,736 | A |   | 3/1970 | Norris |   |
| 3,701,964 | A | * | 10/1972 | Cronin | 439/45 |
| 3,805,117 | A | * | 4/1974 | Hausman | 361/743 |
| 4,089,576 | A | * | 5/1978 | Barchet | 439/507 |
| 4,480,888 | A | * | 11/1984 | Hopkins et al. | 439/267 |
| 4,736,266 | A | * | 4/1988 | Tanibe | 361/816 |
| 4,956,561 | A |   | 9/1990 | Tamer |   |
| 5,217,383 | A | * | 6/1993 | Hildebrandt et al. | 439/259 |
| 5,567,167 | A | * | 10/1996 | Hayashi | 439/75 |
| 5,590,495 | A |   | 1/1997 | Bressler et al. |   |

(Continued)

FOREIGN PATENT DOCUMENTS

DE 9215527 4/1993

(Continued)

OTHER PUBLICATIONS

Office Action issued in U.S. Appl. No. 12/508,396, dated Oct. 14, 2010, 6 pages.

(Continued)

*Primary Examiner* — Neil Abrams
(74) *Attorney, Agent, or Firm* — Michael Best & Friedrich LLP (57) ABSTRACT

An electrical connection system 200 comprises a rail 202 and a plurality of electrically conducting posts 204 fixed to the rail 202. The rail 202 is in the form of a tube or rod provided with complimentary electrical connectors 208 and 210 at opposite ends. Each post 204 is coupled to a rail 202 by a short transverse link 205. A fitting 216 is provided at a free end 206 of each post 204 to facilitate mechanical and electrical connection with a through hole terminal. Pairs of rails 202 may be disposed side by side to form nominal positive and negative rails with the posts of the rails 202 interleaving each other and in mutual alignment. In some instances, photovoltaic tiles 10 that include holes 28 and 30 forming conductive terminals are fitted over posts 204.

21 Claims, 10 Drawing Sheets

U.S. PATENT DOCUMENTS

| | | | |
|---|---|---|---|
| 5,647,915 A | 7/1997 | Zukerman | |
| 6,201,180 B1 | 3/2001 | Meyer et al. | |
| 6,649,822 B2 | 11/2003 | Eguchi et al. | |
| 6,809,253 B2 | 10/2004 | Dinwoodie | |
| 6,928,775 B2 * | 8/2005 | Banister | 52/173.3 |
| 7,156,689 B2 * | 1/2007 | Fabian et al. | 439/417 |
| 7,242,203 B2 * | 7/2007 | LaMeres et al. | 324/758 |
| 7,740,497 B2 | 6/2010 | Nightingale | |
| 2009/0095339 A1 | 4/2009 | Nightingale | |
| 2009/0096218 A1 | 4/2009 | Nightingale | |
| 2009/0097961 A1 | 4/2009 | Nightingale | |
| 2009/0120484 A1 * | 5/2009 | Nightingale | 136/244 |
| 2009/0239396 A1 * | 9/2009 | Tay et al. | 439/66 |
| 2010/0051082 A1 * | 3/2010 | Kang et al. | 136/244 |
| 2010/0065100 A1 | 3/2010 | Nightingale et al. | |
| 2010/0065107 A1 | 3/2010 | Nightingale et al. | |
| 2010/0068030 A1 | 3/2010 | Nightingale et al. | |
| 2010/0068926 A1 * | 3/2010 | Nightingale et al. | 439/577 |
| 2010/0078058 A1 | 4/2010 | Nightingale et al. | |

FOREIGN PATENT DOCUMENTS

| | | |
|---|---|---|
| DE | 20108348 | 8/2001 |
| EP | 0573239 | 12/1993 |
| EP | 1313179 | 5/2003 |
| JP | 60149178 | 8/1985 |
| SG | 152072 A1 | 5/2009 |
| SG | 152073 A1 | 5/2009 |
| WO | 2007/132027 * | 11/2007 |

OTHER PUBLICATIONS

International Search Report for PCT/SG2009/000332.
Singapore Search Report for Application 200806821-5.

* cited by examiner

ELECTRICAL CONNECTION SYSTEM

FIELD OF THE INVENTION

The present invention relates to an electrical connection system for providing electrical connection between one or more first electrical devices having a through hole electrical terminal, and a second electrical device or apparatus.

BACKGROUND OF THE INVENTION

Applicant has previously devised a photovoltaic tile assembly for supplementing the energy needs of a building. The photovoltaic assembly also acts as a waterproof covering, replacing conventional slate, tile or tin coverings.

The assembly comprises a base tile through which one or more mechanical fasteners are driven for fastening to an underlying roof structure, and one or more cover tiles that are attached to, and overly, the base tile. Each of the cover tiles is provided with a photovoltaic cell for converting solar energy into electrical energy. The cover tiles are electrically coupled together by an electrical connection system that comprises a plurality of tubes and connection posts. The tubes are seated within recesses formed in walls provided in each base tile and the posts are supported in holes in the base tile that extend to these recesses. Each tube is provided with a slot and a dog leg recess leading form the slot for each post. The slot is placed over the end of a row of posts and then rotated to engage the ends of the posts in respective dog leg recesses.

Opposite ends of the posts are disposed above the surface of the base tile and can pass into through hole electrical terminals provided on the cover tiles. A pair of electrical conductors is embedded in each tube and are electrically insulated from each other to provide nominal positive and negative conductors, so that posts connected with the tube can be connected to the terminals of the cover tiles.

Further details of applicant's prior electrical connection system are described in Singapore patent application numbers 200716872-7 and 200716871-9.

The present invention is a result of further research and development in relation to the above described electrical connection system.

SUMMARY OF INVENTION

In the claims which follow and in the preceding description of the invention, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the invention.

One aspect of the present invention provides an electrical connection system for providing electrical connection between one or more first electrical devices or apparatuses each having at least one through hole electrical terminal, and a second electrical device or apparatus, the electrical connection system comprising:

A plurality of conducting posts, each post having a free end configured to connect to the first device via a respective through hole electrical terminal, and a plurality of electrical conductors that electrically connect the posts together.

In one embodiment each electrical conductor comprises a conducting rail to which a plurality of the posts is connected. In this embodiment the rails may be provided with a first electrical connector at one end and a complementary second electrical connector at a second end whereby the first electrical connector of one rail can be electrically connected with a second electrical connector of a second rail to provide electrical continuity between the first and second rails.

One or both of the first and second electrical connectors may be provided with a degree of resilience so as to apply a mechanical force between first and second electrical connectors when coupled together, the mechanical force acting to maintain coupling between the first and second electrical connectors.

In one embodiment, the first electrical connector is in the form of a socket and the second electrical connector is in the form of a plug provided with resilient or resiliently supported contacts, such as a banana plug.

The first and second electrical connectors may further be configured to form, when engaged with each other, a mutual contact surface of variable length.

Each post may be either integrally formed with its respective conducting rail or alternatively formed separately of and subsequently fixed to its respective rail.

As an alternative to the conducting rails, the electrical conductors may be in the form of one or more wires, or one or more conducting tracks on a circuit board. In such an embodiment the wires or tracks may be configured to enable custom connection to the posts to provide selectable connection configurations. For example the wires or tracks can be connected to the posts to provide a series connection between electrical devices, such as a photovoltaic tile, connected to the posts. In these embodiments the posts may be soldered or brazed to the wires or tracks. Further the connected posts and conductors may be encapsulated. When the electrical conductors and posts are encapsulated to form an electrical connection tile, the free end of each post is left free of encapsulant so as to be accessible to facilitate electrical connection between one or more first electrical devices or apparatuses. This may be by way of the free end simply being located above a surface of the encapsulating material or the free end being flush with that surface so that a connector can be inserted into the free end.

In embodiments where the electrical connection system is supported in or on a substrate the substrate may be formed with a plurality of sockets for seating respective posts. The post may be configured relative to the post to provide an interference fit to the post. Additionally one or both of the sockets and the posts may be further configured to clamp an end of a wire there between to provide electrical connection between the wire and the post.

A free end of each post is provided with a fitting to enable mechanical and electrical connection to the electric terminal. The one embodiment, the fitting may comprise a plurality of resilient or resiliently supported radially extending projections, such as fins, barbs or fingers, formed about the free end of the post. In an alternate embodiment, the fitting may comprise a laterally extending spring and one or more electrically conducting projections spaced from the spring wherein, when a free end of a post is passed through the electric terminal, the spring is on one side of the first electrical device to bias an opposite side of the first electrical device into contact with the projections.

In a further variation, the fitting may comprise a combination of a screw thread formed on the free end of the post and a nut adapted to be screwed onto the thread. In this embodiment, the nut may be housed in a cap. The cap may be made from a transparent or a translucent material, such as plastics material. In yet a further variation, the fitting may comprise a threaded bore formed in the posts and a screw or bolt that threading engages the post.

In one embodiment of the electrical connection system, the rail is one of a pair of rails, respective rails in the pair being arranged to act as a nominal positive rail and a negative rail. When the rails are provided in pairs, the rails in each pair may be further arranged so that their respective posts are alternatively disposed in a direction parallel to the rails. Further, the rails in each pair may be configured so that their respective posts are in mutual alignment with each other.

A further aspect of the present invention provides an electrical connection system for providing electrical connection between one or more first electrical devices or apparatuses each having at least one through hole electrical terminal, and a second electrical device or apparatus, the electrical connection system comprising:

A rail made of an electrically conducting material and one or more electrically conducting posts extending from the rail, each post having a free end configured to pass through a respective through hole electric terminal and electrically contact the electric terminal.

A further aspect of the invention provides an electrical connection system for providing mechanical and electrical connection between one or more first electrical devices or apparatuses each having at least one through hole electrical terminal, and a second electrical device or apparatus, the electrical connection system comprising:

A plurality of conducting posts, each post having a free end configured to connect to the first device via a respective through hole electrical terminal, and a plurality of electrical conductors that electrically connect the posts together, and wherein a free end of each post is provided with a fitting to enable mechanical connection to the electric terminal via the through hole.

DESCRIPTION OF THE DRAWINGS

An embodiment of the present invention will now be described by way of example only with reference to the accompanying drawings in which:

FIG. 2d is an equivalent electrical circuit diagram for the electrical connection system shown in FIG. 2a;

DETAILED DESCRIPTION OF PREFERRED EMBODIMENTS

Embodiments of the electrical connection system 200 will be described in the context of a photovoltaic tile assembly 300 depicted in FIGS. 1, 2a, 2d and 3-6. The photovoltaic tile assembly 300 comprises a base tile 100 (see FIGS. 2a, 2d, 3 and 5) and a plurality of photovoltaic cover tiles 10 (see FIGS. 4 and 5). A plurality of electrical connection systems 200 is supported in each base tile and provides electrical connection between the photovoltaic cover tiles 10 on a base tile and a remote electrical device such as a battery, water heater, inverter or electrically powered machine. The photovoltaic cover tiles 10 are provided with through hole electrical terminals 28, 30 to which the electrical connection system 200 electrically coupled. The base tile 100 is formed as a bottom shell 110 defining a cavity 116 in which the electrical connection system 200 is supported and a top shell 120 that covers and seals the cavity 116. Posts 204 of each electrical connection system 200 extend beyond an upper surface 104 of the base tile to enable connection with the photovoltaic cover tiles 10.

While embodiments the electrical connection system 200 are described in the context of the photovoltaic tile assembly 300 application of the system 200 is not restricted to such use. Embodiments of the electrical connection system 200 may be used to electrically couple electrical devices other than photovoltaic tiles to each other and/or other electrical devises and apparatuses.

FIGS. 2a, 2b, 2d, 3 and 6 depict one form of the electrical connection system 200 comprising a rail 202 and a plurality of electrically conducting posts 204. In this embodiment, the rail 202 is in the general form of a square section metallic tube or rod. The posts extend parallel to each other and perpendicular to the rail 202. Each post 204 is coupled to the rail 202 by a short transverse link 205. In one embodiment, the posts 204 may be welded, brazed or soldered to the links 205 which may be formed integrally with the rail 202. Alternatively the links 205 may be formed separately and subsequently attached to the rail 202. In a further variation it is possible for the posts 204 to be provided with a detachable coupling for connecting to the links 205. In yet a further variation the rail 202 and posts 204 may be integrally formed.

Figure 6:
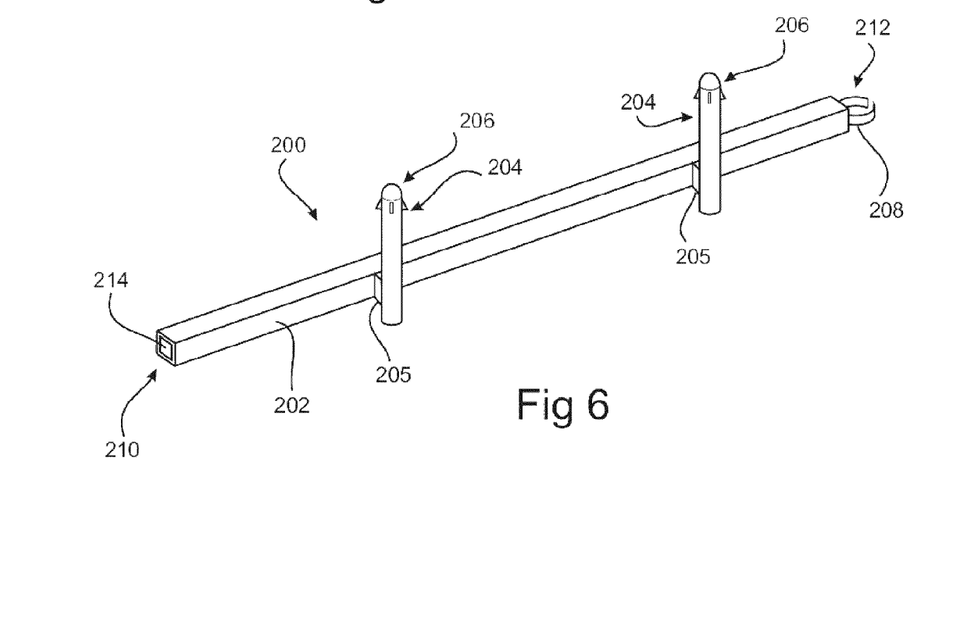
FIG. 6 is a schematic representation of an embodiment of the electrical connection system.

A male connector 208 and female connector 210 at opposite ends of the rail 202 constitute one form of complementary connectors that may be utilized in the electrical connection system 200 to enable electrical connection between adjacent rails 202. In this embodiment, the male connector 208 is in the form of two spring arms 212 formed at one end of a rail 202, while the female connector 210 is in the form of a simple hole 214 at the opposite end of the rail 202. The spring arms 212 and the hole 214 are relatively configured so that when the spring arms 212 are inserted into the hole 214 they provide a degree of resilience to apply a mechanical bias force. This acts to provide both mechanical and electrical coupling between adjacent rails 202.

As will be understood by those skilled in the art, numerous different types of configuration of electrical connectors may be provided at the opposite ends of each rail 202. For example, the spring arms 212 may be replaced with a banana plug type connector. Alternatively, the connector 208 may be provided with one or more sprung contact balls which contact the inside surface of the hole 214. Indeed, the inside surface of the hole 214 may also be provided with complementary shaped recesses for receiving corresponding sprung balls. This will provide a snap-type fitting.

Figure 3:
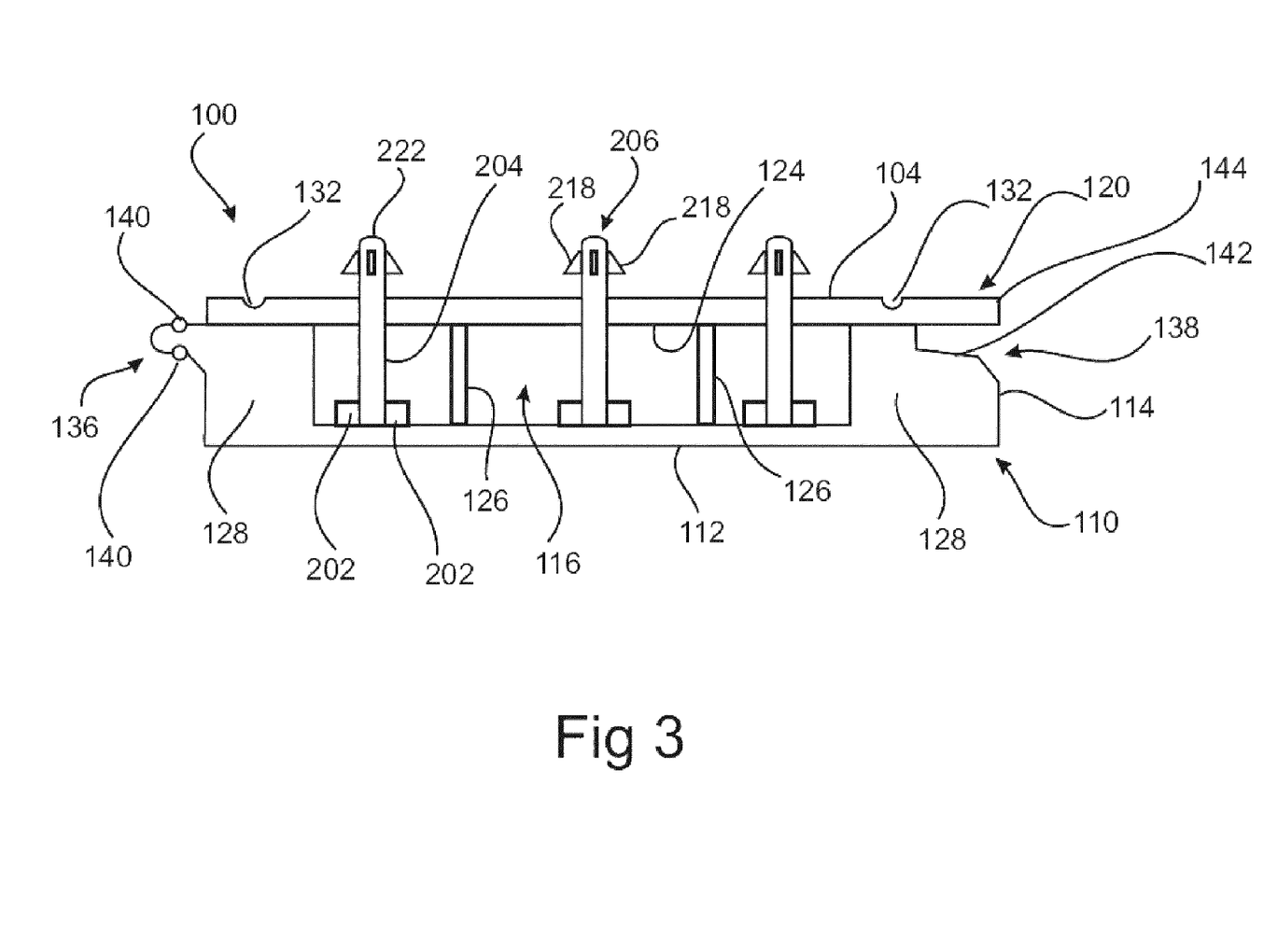
FIG. 3 is a view of section AA of the base tile shown in FIG. 2b and depicting an embodiment of an incorporated electrical connection system.
Figure 5:
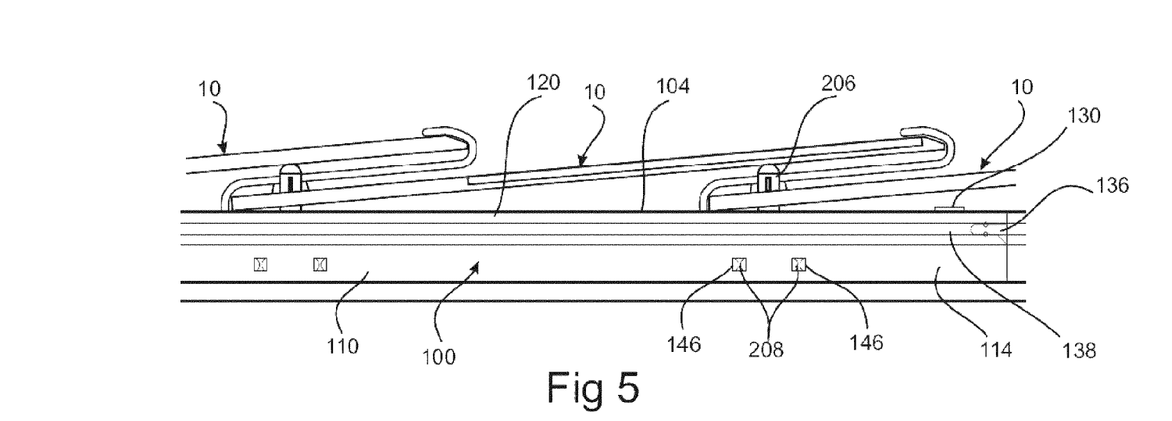
FIG. 5 is a side view of the photovoltaic tile assembly shown in FIG. 1 and depicting relationship between the electrical connection system, base tile and photovoltaic tile.

As previously described and shown in FIGS. 3 and 5, the free end 206 of each post 204 extends above the first surface 104 of the base tile 100. The free end 206 is provided with a fitting 216 to enable electrical connection and optionally mechanical coupling to an electrical component. In this particular embodiment, the electrical component is a photovoltaic tile 10 which is provided with through hole terminals 28 and 30. The construction of the photovoltaic tile 10 is described in Applicant's co-pending application entitled "PHOTOVOLTAIC TILE."

Four different forms of fitting 216 are described in this specification, however those skilled in the art will appreciate that any other specific construction of fitting 216 that performs the same function as the embodiments described hereinafter can of course be used with other embodiments the present invention.

Figures 7, 8:
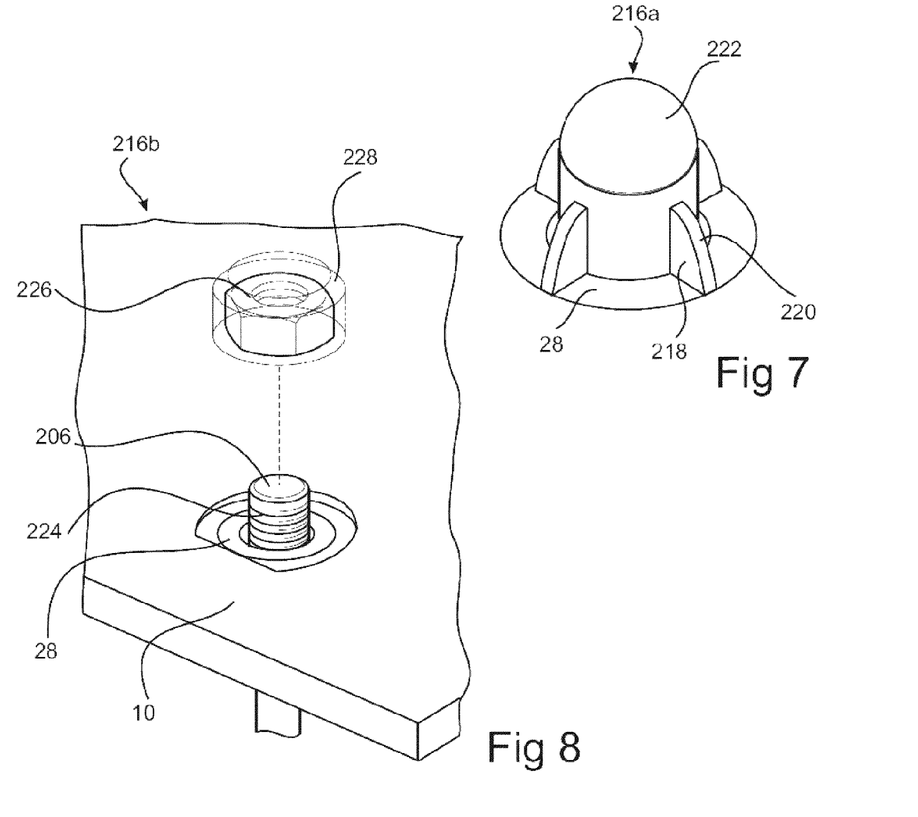
FIG. 7 is a representation of one form of fitting that may be used in the electrical connection system.
FIG. 8 is representation of a second form of fitting that may be incorporated in the electrical connection system.

One form of fitting 216a which comprises a plurality of resilient or resiliently supported radially extending projections in the form of fins or barbs 218 is shown in FIGS. 3, 5 and 7. Here, four fins 218 are shown evenly disposed about the free end 206 of the post 202. Each fin is formed with a rounded upper shoulder 220 and is spring biased outward of the post 204. That is, the fins 218 can be moved in a radial inward direction against the spring bias to allow the free end 206 to pass through, for example, the through hole terminal 28. Once the free end 206 is passed through the connector 28, the fins 218 extend radially outward by action of a spring and their lower surface bears on and thus make electrical contact with the terminal 28. It will be further appreciated that the fins 218 provide mechanical coupling to retain the photovoltaic tile 10. In order to mechanically separate the photovoltaic tile 10 from the post 204, the fins 218 must be pushed radially inward against the spring to an extent that collectively they circumscribe a circle having a diameter smaller than an inner diameter of the terminal.

A resilient cap 222 is fitted to the top of the free end 206 to provide a degree of cushioning to an overlying photovoltaic tile 10 when the electrical connection system 200 is utilized in a solar electric roof panel.

FIG. 8 depicts a second form of fitting 216b which comprises the combination of a screw thread 224 formed about the free end 206 of a post 204, and a threaded cap 226 that can be screwed onto the thread 224. The cap 226 is made from an electrically conducting material. In one variation, in order to minimise the risk of the ingress of water and possible corrosion to both the fitting 216b and the terminal 28, the nut 226 may be formed with a blind hole rather than a through hole.

In a further variation or modification, the nut 226 may be embedded or carried by a cap 228. In one form, the cap 228 may be formed of a transparent or translucent plastics material. This may assist installers in lining up the nut 226 with the post 204. A waterproof seal in the form of an O-ring may also be embedded in a bottom surface of the cap 228, to form a seal against the terminal 28 to prevent the ingress of water and thus minimize the risk of corrosion of the terminal 28 and the fitting 216b. Alternatively, the entire cap 228 may be formed of a resilient material.

Figure 9:
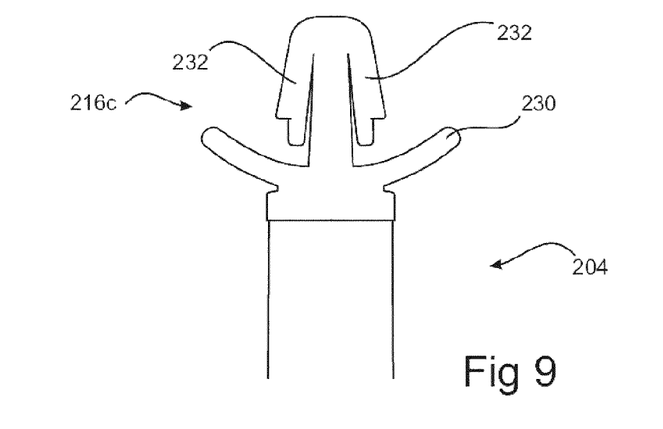
FIG. 9 is a representation of a third form of fitting that may be incorporated in the electrical connection system; and, FIG. 10 is a representation of a fourth form of fitting that may be incorporated in the electrical system.

FIG. 9 depicts a further variation of the fitting 216c. In this embodiment, the fitting 216c comprises the combination of a radially extending spring 230 which extends from opposite sides of the free end 206, and a pair of electrically conducting fingers 232 spaced above the spring 230. The fingers 232 are resiliently supported so that they may be sprung radially inward to enable them to pass through the through hole terminal 28. Thus in order to couple a photovoltaic tile 10 to a post 204 provided with a fitting 216c, the fingers 232 are sprung inwardly as the photovoltaic tile 10 is pushed onto the free end 206. The spring 230 is deflected downwardly during this process. When the tile 10 has been pushed down so that the fingers 232 are now clear of the terminal 28, they release to spring outwardly to an extent beyond the internal diameter of the terminal 28. The spring 230 applies a bias on the underside of the photovoltaic tile 10 to thereby assist in maintaining electrical contact between the fingers 232 and the terminal 28.

Figure 1:
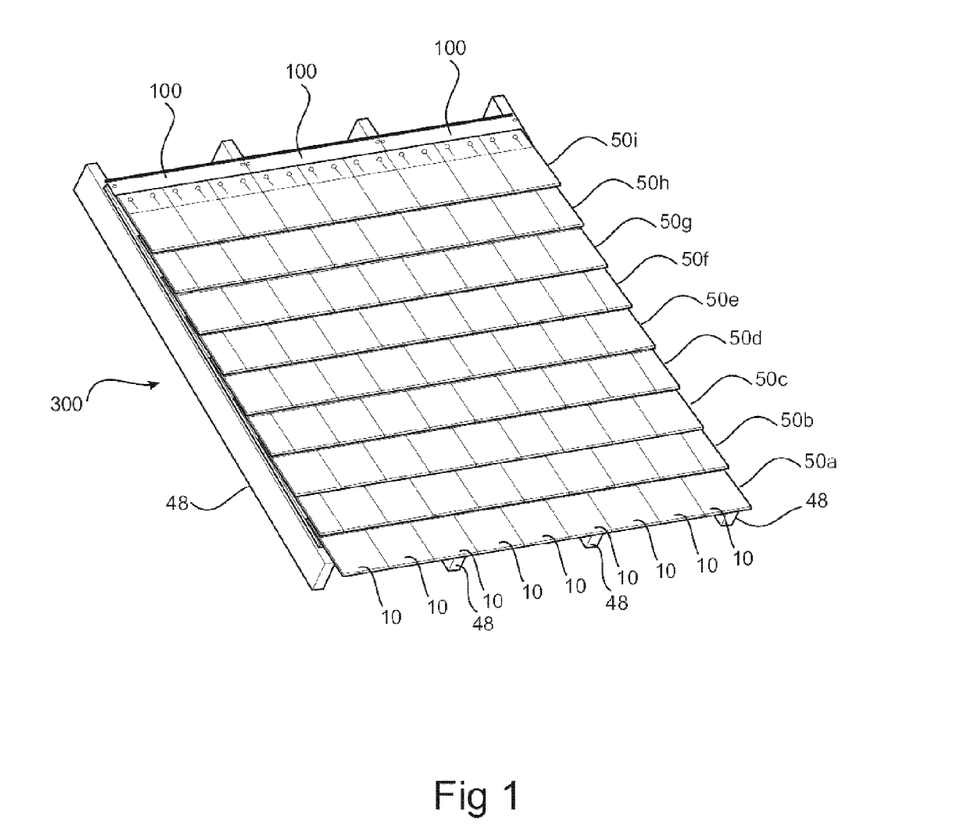
FIG. 1 is a representation of a portion of a roof provided with a photovoltaic tile assembly in which an embodiment of the present electrical connection system is incorporated.
Figure 2A:
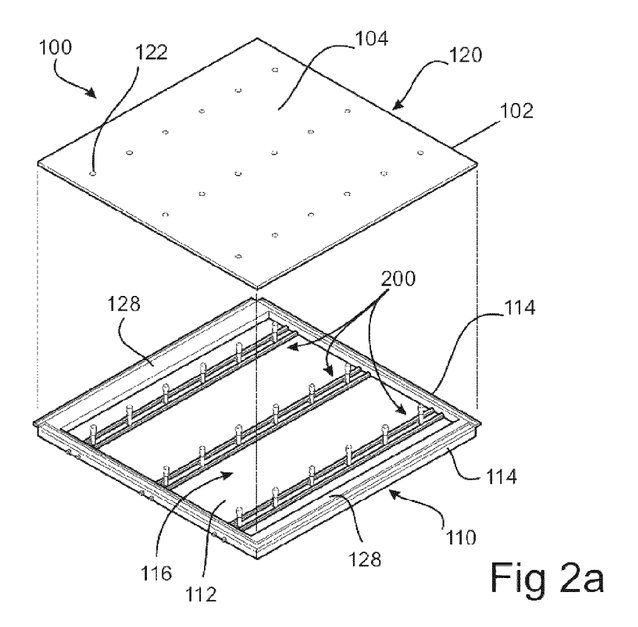
FIG. 2a is an exploded view of a base tile of the photovoltaic tile assembly depicted in FIG. 1.
Figure 2B:
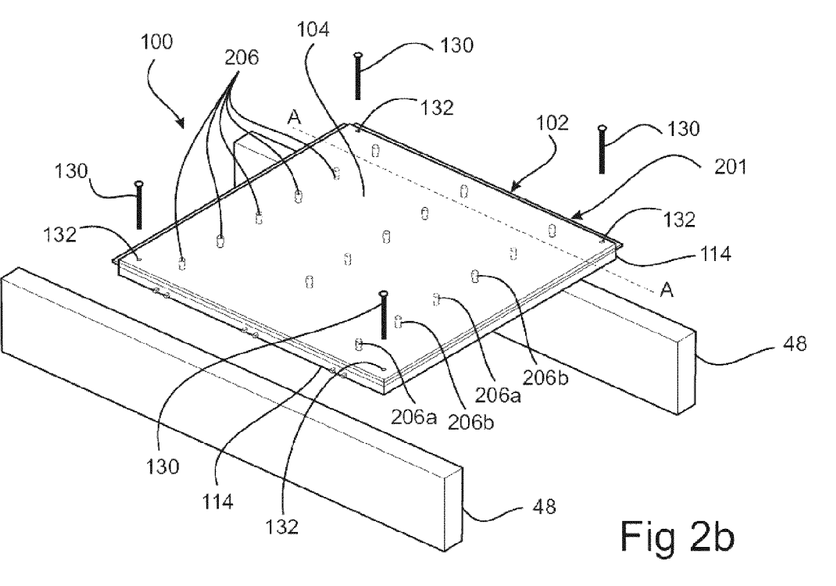
FIG. 2b is a representation of an assembled base tile being attached to a roof structure.
Figure 2C:
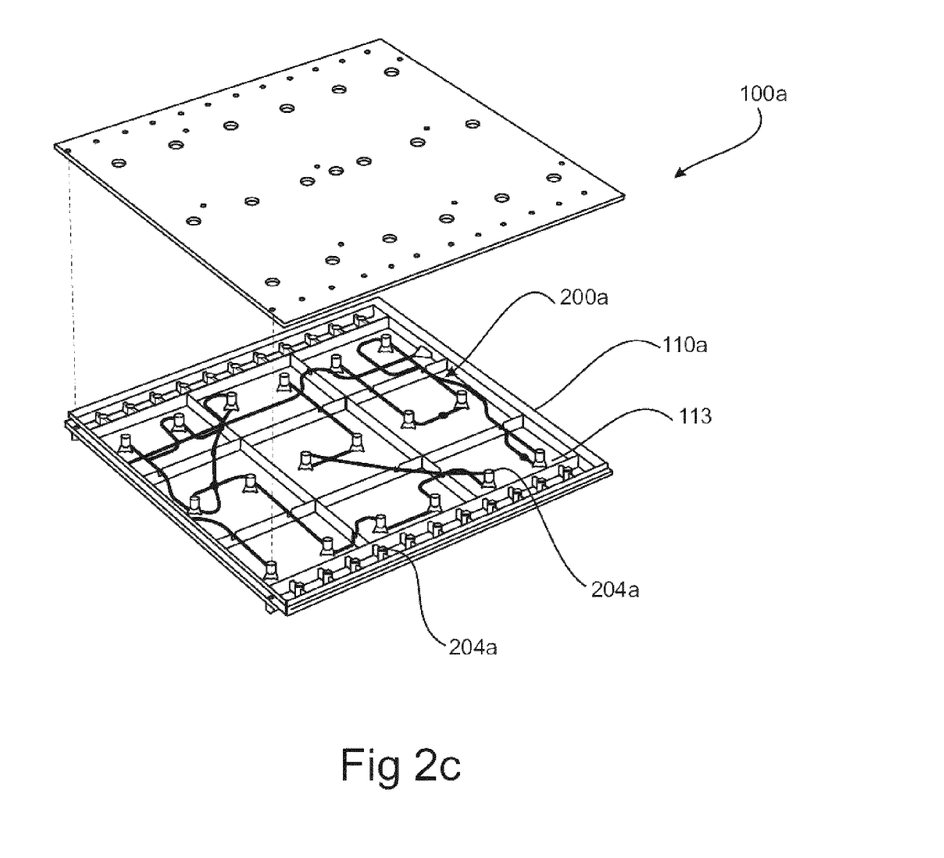
FIG. 2c is a partial exploded view of a base tile of the photovoltaic tile assembly depicted in FIG. 1 incorporating an alternate embodiment of the electrical connection system.
Figure 2D:
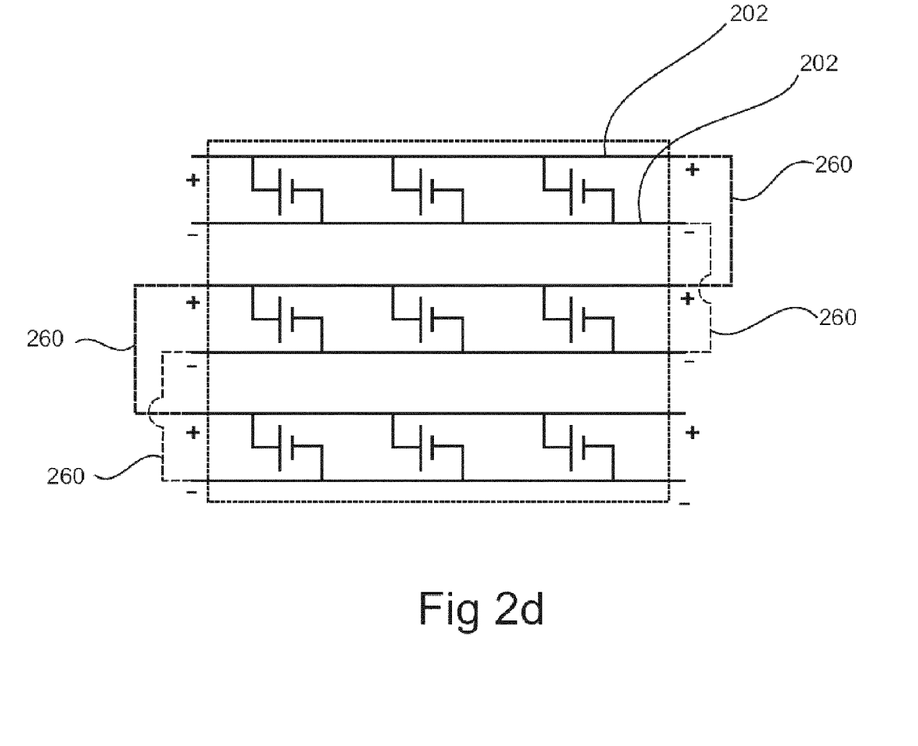
Figure 2E:
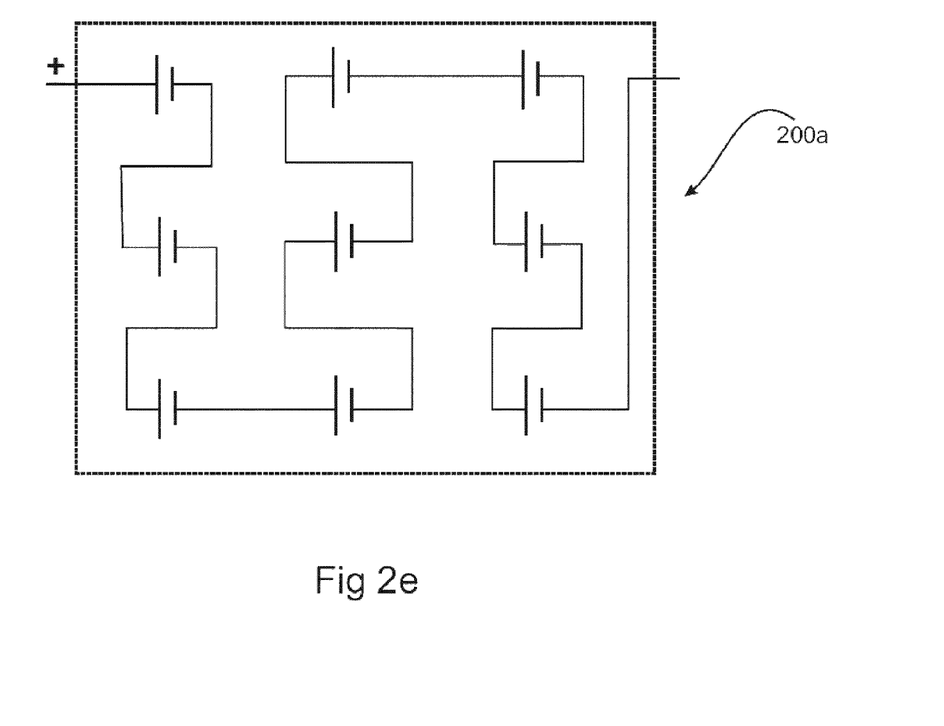
FIG. 2e is an equivalent electrical circuit diagram for the electrical connection system shown in FIG. 2c.
Figure 10:
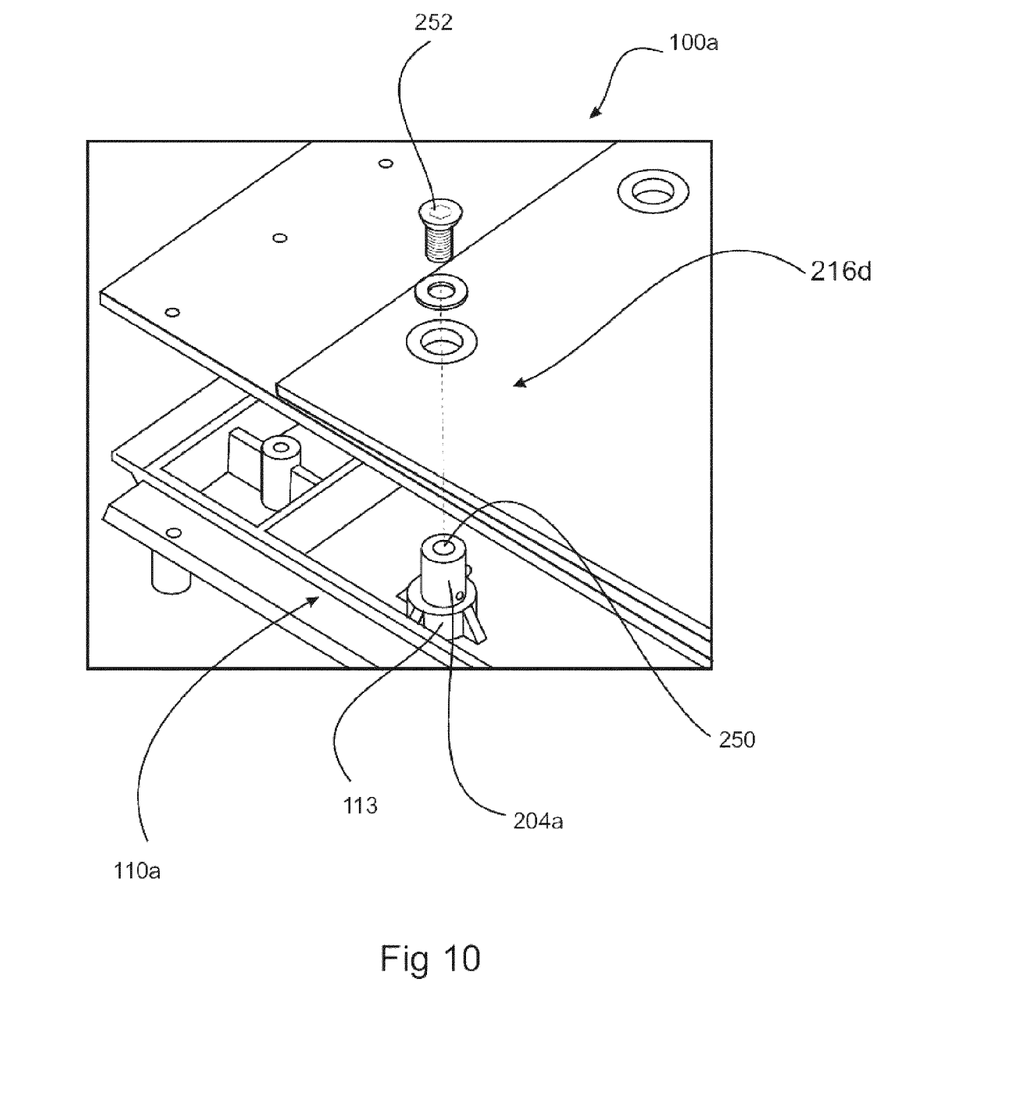

FIGS. 10, 2c and 2e depict an alternate from for fitting 216d and corresponding alternate form of base tile 100a and electrical connection system 200a. The fitting 216d comprises a threaded bore 250 provided axially in each post 204a and a corresponding threaded screw or bolt 252 having a shank that passes through the electrical terminals 28 and 30 of a photovoltaic tile 10. The fitting 216d thus provide electrical connection between the photovoltaic tile 10 and the electrical connection system 200a, while also mechanically securing the tile 10 the base tile 100a.

In this embodiment of the electrical connection system 200a the electrical conductors are in the form of wires 202a rather than rails 200. The use of wires 202a enables electrical connection of the posts 204a in a customized manner to provide a desired electrical connection configuration. For example as shown in FIG. 2e a series connection of all photovoltaic cells can be achieved to provide greater output voltage. The wires may be connected to the posts by soldering or brazing. When this form of the electrical connection system is used with the base tile 100a, a plurality of bosses 113 may be formed on and extending upward from an inside surface of the bottom shell 110a into which the posts can be press or interference fit. The press or interference fit can also provide an alternate connection mechanism, where the wire is in effect clamped between the boss and post to provide an electrical connection. If desired the cavity 116 can be filled with an encapsulating resin.

In a variation to the embodiment where the conductors are in the form of wires, the wires and posts may be pre-connected to provide the desired circuit configuration, with the posts held in the required position to enable connection to the photovoltaic tiles 10, then encapsulated to form an electrical connection tile that can be dropped into the cavity 116. As an alternative to encapsulating, the base tile could be molded about the pre-connected wires 202a and posts 204a to form an integrated tile and electrical connection system.

In yet a further alternative the electrical connector can be in the form of one or more conductive tracks formed on a circuit board, with the posts subsequently soldered or brazed to the circuit board. The board can then be dropped into the cavity 116. Prior to doing this the entire board can be encapsulated for example in a resin/epoxy to form an electrical connection tile that can provide thermal insulation for the base tile 100a. When the posts 204a are used in conjunction with the fittings 216d the posts can be made of a length to extend between the inside surface of the bottom shell 110 and the inside surface of the top shell 120. In this way the posts can also provide mechanical strength to the base tile 100.

When the electrical conductors are in the form of wires or tracks on a circuit board complimentary electrical connectors identical or similar to the male and female connectors 208 and 210 are attached to opposite ends of the circuit formed by the connected wires or tracks to facilitate electrical connection between adjacent electrical connection systems.

Figure 4:
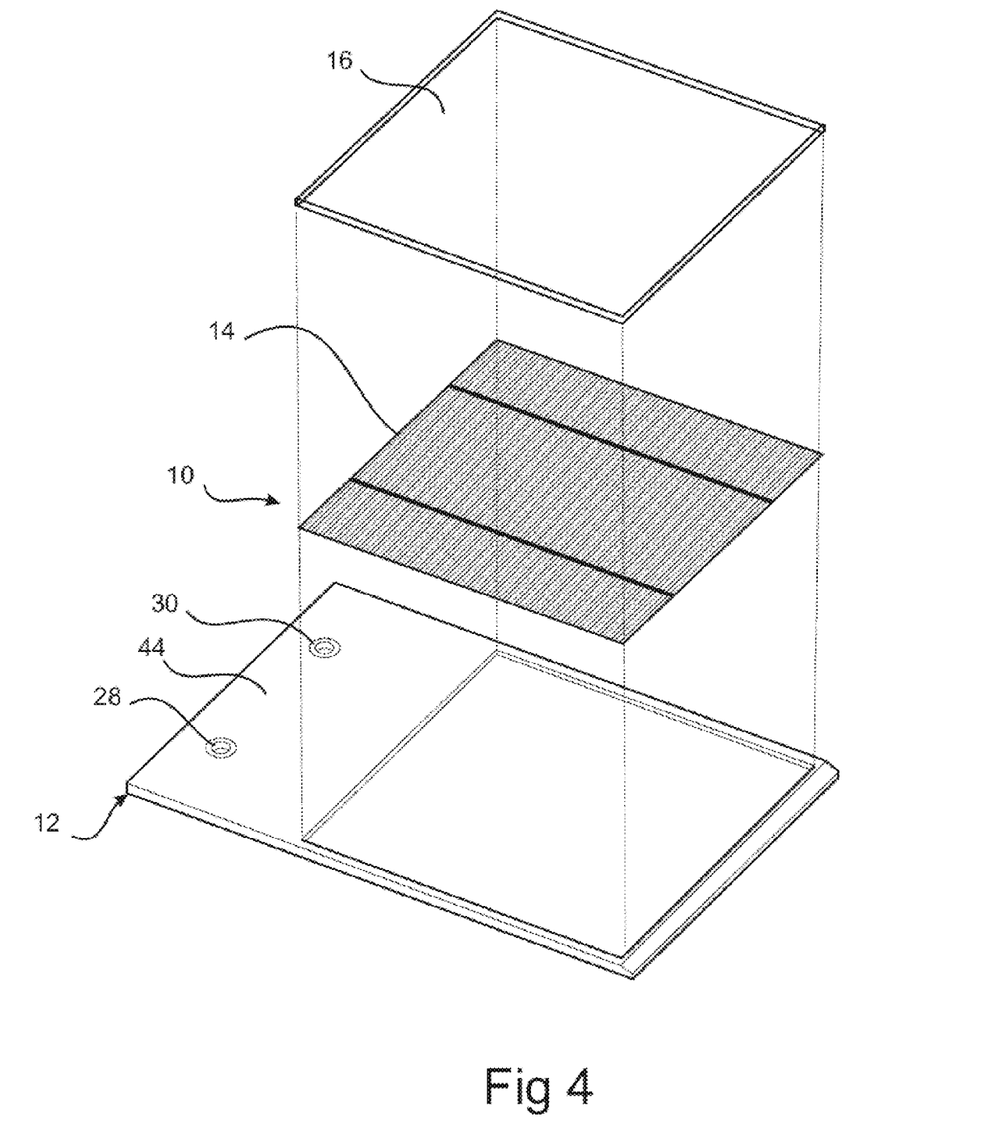
FIG. 4 is an exploded view of a photovoltaic tile incorporated in the photovoltaic tile assembly.

In the particular embodiment of the electrical connection system 200 shown in FIGS. 2a, 2b, and 4, the rails 202 are arranged in pairs. This enables respective rails in the pair to act as a nominal positive rail and a nominal negative rail. Further, as shown in the above mentioned figures together with FIG. 4, the rails 202 in each pair are arranged so that their respective posts 204 are alternatively disposed in a direction parallel to the rails 202, and more particularly are in mutual alignment. For example with reference to FIG. 2b, which shows the free ends 206 of post 204 extending above the surface 104 of a base tile 100, each second free end 206a in a bottom row 201 is connected to the same rail 202, with each interleaving pair of post 206b coupled to the other rail in the rail pair. Thus when a photovoltaic tile 10 is mounted on a base tile 100 the terminals 28 and 30 of the tile 10 are electrically coupled with posts 204 of different rails 202 in a rail pair.

The rails 202 of each pair provide a parallel connection for the connected tiles 10 as shown in FIG. 2d ignoring the phantom connections 260. Thus one base tile 100 will provide three independent "banks" of parallel connected tiles 10. The pairs of rails in one base tile connect to corresponding pairs of rails on adjacent base tiles 100. This provides an extended parallel connection of the tiles 10 along the base tiles 100. However in a minor variation the electrical connection system may be modified to provide a series connection between the three pairs of rails in each base tile 100 thus providing a series connection of three banks of parallel connected tiles 10 (which is equivalent to all of the tiles 10 being connected together in parallel with each other on one and the same base tile 100). This is depicted by the phantom connections 260 in FIG. 2d.

Now that an embodiment of the invention has been described in detail it will be apparent to those skilled in the relevant arts that numerous modifications and variations may be made without departing from the basic inventive concepts. For example, while the posts 204 are described and illustrated as extending perpendicular to its corresponding rail 202 this need not be the case. For example, the posts 204 may extend diagonally of, or in the same plane as, the rails 202. Additionally, there is no requirement for the posts 204 of a rail to extend in the same direction to each other (i.e, to be parallel). For example if desired alternating posts 204 attached to the same rail 202 may extend in different directions. Further, the posts 204 may be provided on both sides of the rail 202.

All such modifications and variations together with others that would be obvious to persons skilled in the art are deemed to be within the scope of the present invention the nature of which is to be determined from the above description and the appended claims.

The claims defining the invention are as follows:

1. An electrical connection system for providing electrical connection between one or more first electrical devices or apparatuses each having at least one through hole electrical terminal, and a second electrical device or apparatus, the electrical connection system comprising:
    a plurality of conducting posts, each post having a free end configured to connect to the first device via a respective through hole electrical terminal, and a plurality of electrical conductors that electrically connect the posts together,
    wherein the electrical conductors and posts are encapsulated to form an electrical connection tile, and wherein the free end of each post is accessible to facilitate electrical connections between the one or more first electrical devices or apparatuses.

2. The electrical connection system according to claim 1 wherein each electrical conductor comprises a conducting rail to which a plurality of the posts is connected.

3. The electrical connection system according to claim 2 wherein each post is either integrally formed with its respective conducting rail or alternatively formed separately of and subsequently fixed to its respective rail.

4. The electrical connection system according to claim 2 wherein the rail is one of a pair of rails, respective rails in the pair being arranged to act as a nominal positive rail and a negative rail.

5. The electrical connection system according to claim 4 wherein when the rails are provided in pairs the rails in each pair are further arranged so that their respective posts are alternatively disposed in a direction parallel to the rails.

6. The electrical connection system according to claim 4 wherein the rails in each pair are configured so that their respective posts are in mutual alignment with each other.

7. The electrical connection system according to claim 1 wherein each electrical conductor comprises one or more wires, or one or more conducting tracks on a circuit board.

8. The electrical connection system according to claim 7 wherein the wires or tracks are configured to enable custom connection to the posts to provide selectable connection configurations.

9. The electrical connection system according to claim 8 wherein the wires or tracks are configured to provide a series connection between the one or more first electrical devices or apparatuses.

10. The electrical connection system according to claim 1 further comprising a first electrical connector and a complementary second electrical connector wherein the first electrical connector is coupled to an end of the electrical conductor connected to a first of the posts and the second electrical connector is coupled to an end of the electrical conductor connected to a last of the posts whereby the first electrical connector of one electrical connection system can be electrically connected with a second electrical connector of a second electrical connection system to provide electrical continuity between the first and second electrical connection systems.

11. The electrical connection system according to claim 10 wherein one or both of the first and second electrical connectors are provided with a degree of resilience so as to apply a mechanical force between first and second electrical connectors when coupled together, the mechanical force acting to maintain coupling between the first and second electrical connectors.

12. The electrical connection system according to claim 11 wherein the first electrical connector is in the form of a socket and the second electrical connector is in the form of a plug provided with resilient or resiliently supported contacts.

13. The electrical connection system according to claim 10 wherein the first and second electrical connectors are configured to form, when engaged with each other, a mutual contact surface of variable length.

14. The electrical connection system according to claim 1 wherein a free end of each post is provided with a fitting to enable mechanical and electrical connection to the electric terminal.

15. The electrical connection system according to claim 14 wherein the fitting comprises a plurality of resilient or resiliently supported radially extending projections, such as fins, barbs or fingers, formed about the free end of the post.

16. The electrical connection system according to claim 15 wherein the fitting comprises a laterally extending spring and one or more electrically conducting projections spaced from the spring wherein, when a free end of a post is passed through the electric terminal, the spring is on one side of the first electrical device to bias an opposite side of the first electrical device into contact with the projections.

17. The electrical connection system according to claim 14 wherein the fitting comprises a combination of a screw thread formed on the free end of the post and a nut adapted to be screwed onto the thread.

18. The electrical connection system according to claim 17 wherein the nut is housed in a cap.

19. The electrical connection system according to claim 18 wherein the cap is made from a transparent or translucent material.

20. An electrical connection system for providing electrical connection between one or more first electrical devices or apparatuses each having at least one through hole electrical terminal, and a second electrical device or apparatus, the electrical connection system comprising:

rails made of an electrically conducting material and one or more electrically conducting posts extending from the rails, each post having a free end configured to pass through a respective through hole electric terminal and electrically contact the electric terminal, wherein the rails and posts are encapsulated to form an electrical connection tile, and wherein the free end of each post is accessible to facilitate electrical connections between the one or more first electrical devices or apparatuses.

21. An electrical connection system for providing mechanical and electrical connection between one or more first electrical devices or apparatuses each having at least one through hole electrical terminal, and a second electrical device or apparatus, the electrical connection system comprising:

a plurality of conducting posts, each post having a free end configured to connect to the first device via a respective through hole electrical terminal, and a plurality of electrical conductors that electrically connect the posts together, and wherein a free end of each post is provided with a fitting to enable mechanical connection to the electric terminal via the through hole, wherein the electrical conductors and posts are encapsulated to form an electrical connection tile, and wherein the free end of each post is accessible to facilitate electrical connections between the one or more first electrical devices or apparatuses.

* * * * *

UNITED STATES PATENT AND TRADEMARK OFFICE
CERTIFICATE OF CORRECTION

| | | |
|---|---|---|
| PATENT NO. | : 8,007,306 B2 | Page 1 of 1 |
| APPLICATION NO. | : 12/432431 | |
| DATED | : August 30, 2011 | |
| INVENTOR(S) | : Christopher George Edward Nightingale et al. | |

It is certified that error appears in the above-identified patent and that said Letters Patent is hereby corrected as shown below:

Assignee:

"Dragon Engergy Pte. Ltd." should be --Dragon Energy Pte. Ltd.--

Signed and Sealed this

Twenty-second Day of November, 2011

David J. Kappos
*Director of the United States Patent and Trademark Office*

UNITED STATES PATENT AND TRADEMARK OFFICE
CERTIFICATE OF CORRECTION

PATENT NO. : 8,007,306 B2
APPLICATION NO. : 12/432431
DATED : August 30, 2011
INVENTOR(S) : Christopher George Edward Nightingale et al.

Page 1 of 1

It is certified that error appears in the above-identified patent and that said Letters Patent is hereby corrected as shown below:

Title Page, Item (73) Assignee:

"Dragon Engergy Pte. Ltd." should be --Dragon Energy Pte. Ltd.--

This certificate supersedes the Certificate of Correction issued November 22, 2011.

Signed and Sealed this
Third Day of January, 2012

David J. Kappos
*Director of the United States Patent and Trademark Office*